United States Patent [19]
Garofalo et al.

[11] Patent Number: 5,153,083
[45] Date of Patent: Oct. 6, 1992

[54] METHOD OF MAKING PHASE-SHIFTING LITHOGRAPHIC MASKS

[75] Inventors: Joseph G. Garofalo, South Orange; Robert L. Kostelak, Jr., Morris Plains; Sheila Vaidya, Watchung, all of N.J.

[73] Assignee: AT&T Bell Laboratories, Murray Hill, N.J.

[21] Appl. No.: 622,687

[22] Filed: Dec. 5, 1990

[51] Int. Cl.⁵ .......................... G03F 1/00; G03F 9/00
[52] U.S. Cl. ...................................... 430/5; 430/313; 430/318
[58] Field of Search .................. 430/5, 312, 313, 314, 430/317, 318, 296, 322, 323, 324, 329

[56] References Cited

U.S. PATENT DOCUMENTS

| | | | |
|---|---|---|---|
| 4,906,326 | 3/1990 | Amemiya | 430/5 |
| 4,985,319 | 1/1991 | Watakabe | 430/5 |
| 5,045,417 | 9/1991 | Okamoto | 430/5 |

OTHER PUBLICATIONS

Nitayama, A. et al., "New Phase Shifting Mask with Self-Aligned Phase Shifters for a Quarter Micron Lithography", *International Electron Device Meeting (IEDM) Technical Digest*, pp. 57-60, (3.3.1-3.3.4) (Dec., 1989).

Primary Examiner—Marion E. McCamish
Assistant Examiner—Kathleen Duda
Attorney, Agent, or Firm—D. I. Caplan

[57] ABSTRACT

Phase-shifting (two-optical-level) masks are manufactured by a self-aligned technique in which after first-level trenches in the mask have been formed, second-level trenches therein are formed by patterning an electron resist overlying the mask in such a manner that the edges of the patterned resist can be located anywhere within the first-level trenches, whereby the need for precise alignment of the resist patterning for the second-level trenches is avoided.

10 Claims, 3 Drawing Sheets

METHOD OF MAKING PHASE-SHIFTING LITHOGRAPHIC MASKS

TECHNICAL FIELD

This invention relates to optical lithography, such as used in the fabrication of semiconductor integrated circuits, and more particularly to methods of making lithographic masks for optically lithographically fabricating such circuits. These masks are also called "reticles" especially when used in optical systems having magnifications different from unity.

BACKGROUND OF THE INVENTION

FIG. 1 shows a typical optical lithographical fabrication system 200, as used for delineating features in a wafer (substrate) 100, typically a semiconductor wafer. More specifically, optical radiation from an optical source 106, such as a mercury lamp, propagates through an aperture in an opaque screen 105, an optical collimating lens 104, a mask or reticle 103, and an optical focusing lens 102. The optical radiation emanating from the reticle 103 focused by the lens 102 on a photoresist layer 101 located on the top major surface of the wafer 100 or, more usually, on various layers on the top surface of the wafer 100. Thus, the pattern of the reticle 103—that is, its pattern of transparent and opaque portions—is focused on the photoresist layer 101. Depending upon whether this photoresist is positive or negative, when it is subjected to a developing process the material of the photoresist is removed or remains at and only at areas where the optical radiation was incident. Thus, the pattern of the mask is transferred to (printed on) the photoresist. Subsequent etching processes, such as wet etching or dry plasma etching, remove selected portions of the substrate or of layer(s) of material(s) (not shown) located between the top surface of the wafer and the bottom surface of the photoresist layer, or of both the substrate and the layer(s). Portions of the substrate or of the layer(s) of material thus are removed from the top surface of the wafer 100 underlying areas where the photoresist was removed by the developing process but not underlying areas where the photoresist remains. Thus, the pattern of the mask 103 is transferred to layer(s) of material(s) overlying the wafer 100, as is desired, for example, in the art of semiconductor integrated circuit fabrication.

In fabricating such circuits, it is desirable to have as many devices, such as transistors, per wafer. Hence it is desirable to have as small a transistor or other feature size as possible, such as the feature size of a metallization stripe—i.e., its width W—or of an isolated aperture in an insulating layer which is to be filled with metal, in order to form electrical connections, for example, between one level of metallization and another. Thus, if it is desired to print the corresponding isolated feature having a width equal to W on the photoresist layer 101, there must exist a feature having a width equal to C located on the mask (reticle) 103. According to geometric optics, if this feature of width C is a simple aperture in an opaque layer, then the ratio W/C=m, where m=L2/L1, i.e., the image distance divided by the object distance, and where m is known as the lateral magnification. When diffraction effects become important, however, the edges of the image become fuzzy and lose their sharpness; and hence the so-called resolution of the mask features when focused on the photoresist layer 101 deteriorates.

In a paper entitled "New Phase-Shifting Mask with Self-Aligned Phase Shifters for a Quarter Micron Lithography" published in *International Electron Device Meeting (IEDM) Technical Digest*, pp. 57-60 (3.3.1-3.3.4) (December, 1989), A. Nitayama et al. taught the use of masks having such features as isolated apertures transparent phase-shifting portions to achieve improved resolution—i.e., improved sharpness of the image of the mask features when focused on the photoresist layer 101. More specifically, these masks comprised suitably patterned transparent optical phase-shifting layers, i.e., layers having edges located at predetermined distances from the edges of the opaque portions of the mask. Each of these phase-shifting layers had a thickness t equal to $\lambda/2(n-1)$, where $\lambda$ is the wavelength of the optical radiation from the source 106 (FIG. 1) and n is the refractive index of the phase-shifting layers, and thus these layers introduced phase shifts (delays) of $\pi$ radians in the optical radiation. By virtue of diffraction principles, the presence of these phase-shifting layers in the masks assertedly produces the desired improved resolution. Such masks are called "phase-shifting" masks.

The mask structure described by A. Nitayama, op.-cit., was manufactured by a process involving a step of wet etching (laterally) an opaque chromium layer located underneath a phase-shifting layer of PMMA which is resistant to the wet etching, whereby the etching of the chromium layer undercut the PMMA layer and formed a phase-shifting mask. However, the amount of chromium thus etched, and hence the positioning of its edges, is difficult to control. Yet the positioning of the edges of the opaque chromium must be carefully controlled in order to yield the desired improved resolution for the mask.

A two-resist-level, non-self-aligned method for manufacturing phase-shifting masks is disclosed in a patent application (J. G. Garofalo 3-4-13) U.S. Pat. No. 07/622680 entitled "Phase-Shifting Lithographic Masks with Improved Resolution" filed concurrently herewith on behalf of the same inventors as those of the present application. However, it would be desirable to have a more alignment-tolerant method of making such masks.

SUMMARY OF THE INVENTION

In accordance with the invention, a self-alignment lithographic technique for making a phase-shifting mask device comprises the steps of:

(a) forming a trench penetrating through the entire thickness of an opaque layer, located on a top major surface of a transparent layer, and through at least a portion of the thickness of the transparent layer;

(b) forming a resist layer over the entire top surface of the opaque layer and of the trench;

(c) patterning the resist layer, whereby it becomes a patterned resist layer having a boundary edge located somewhere within the trench and whereby an area portion of the top surface of the opaque layer becomes exposed; and (d) etching entire thickness of the portion of the opaque layer underlying the area portion, whereby the edges of the transparent layer remain unaffected by the etching and thus form a desired self-aligned phase-shifting layer for the mask device.

In this way, a two-level trench structure is obtained in which all critical edges are patterned during the patterning of the opaque layer. On the other hand, the patterning of the resist layer during step (c) has a desirable amount of margin of error—i.e., can tolerate a relatively large alignment error—because its only geometric requirement is that its edges be located somewhere within the trench in order to produce the desired (precise) self-alignment of the second material layer.

The transparent layer can be a separate transparent film of the same composition as, or different chemical composition from, that of a transparent substrate. Alternatively, in case the etch rate across the major surface of the substrate can be sufficiently well controlled, there is no need for such separate transparent film. The mask, as thus formed, can then be used as the reticle 103 in the system 200 (FIG. 1).

Thus, the invention also involves a photolithographic method, such as for making semiconductor integrated circuits, comprising (1) forming a phase-shifting mask in accordance with the above-recited steps (a), (b), (c) and (d);

(2) directing optical radiation onto the mask, and focusing the radiation onto a photoresist layer located on a major surface of a wafer or on a layer of material located on a major surface of a wafer, such as a semiconductor wafer;

(3) developing the photoresist layer, whereby a patterned photoresist layer is formed; and (4) etching the major surface of the wafer or the layer of material, whereby the pattern of the patterned photoresist layer is transferred to the wafer or to the layer of material.

BRIEF DESCRIPTION OF THE DRAWING(S)

This invention, together with its features, characteristics, and advantages may be better understood from the following detailed description in which.

Only for the sake of clarity, none of the drawings is drawn to any scale. Elements in different Figures which are substantially the same have been denoted by the same reference numerals.

DETAILED DESCRIPTION

Figure 2:
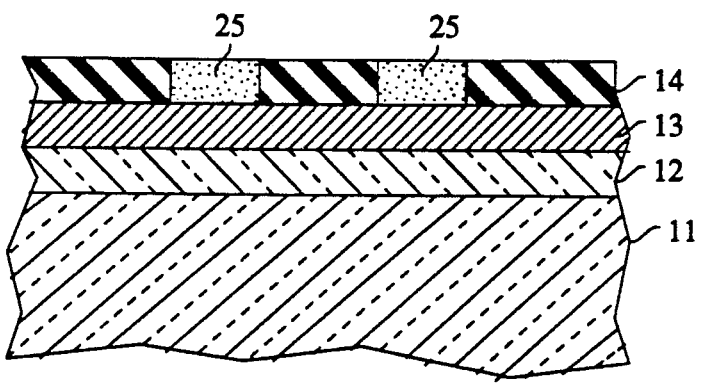
FIGS. 2-5 are side elevational views in cross section of various stages in the manufacture of a phase-shifting mask in accordance with a specific embodiment of the invention.
Figure 5:
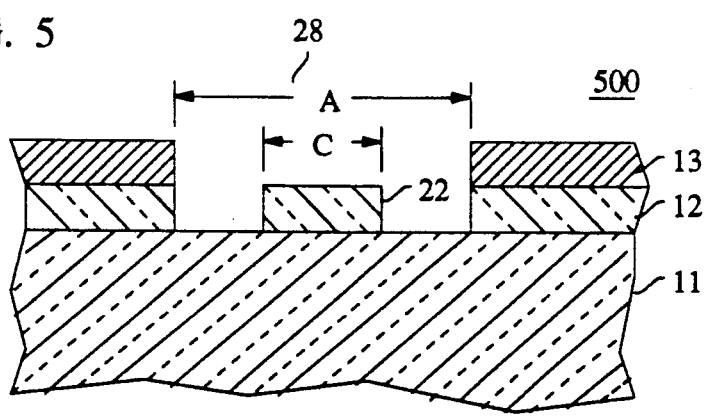

Referring now to the drawings, FIG. 2 shows an early stage in the making of an illustrative portion of a desired phase-shifting lithographic mask 500 shown in FIG. 5. For the sake of definiteness it will be assumed that the feature desired in this portion of the mask 500 is an aperture; but it should be understood that other features can be made, in accordance with the invention, such as a clustered line-space feature, as discussed further below. Layer 14 is an electron beam resist layer, typically polybutylsulfone having a uniform thickness of about 0.5 μm, which has been bombarded by an electron beam in a limited region 25, to a dose sufficient to render the resist "positive"—i.e., sufficient to make the resist in the region 25 dissolve when treated with developing solution(s), as known in the art. This resist layer 14 has been deposited upon a major surface of an opaque layer 13, typically chromium having a uniform thickness of about 0.1 μm. Note that if the layer 13 is electrically conductive, as is chromium, advantageously this layer is grounded during the above-mentioned electron bombardment.

In case the finally desired feature in the mask being manufactured is an isolated square aperture, the region 25 is a square-ring trench; in case the finally desired feature is a line feature (or a cluster of parallel line-space features, not square) the region 25 is a pair (or a cluster, not shown) of elongated parallel trenches. Thus, when viewed from above, typically the region 25 is a square ring or a pair (or a cluster, not shown) of elongated rectangles.

Layer 12 (FIG. 2) serves as a desired phase-shifting layer. It typically is a chemically vapor deposited (CVD) silicon dioxide layer or a spun-on glass layer, typically having a refractive index of about 1.5, which has been deposited on a major surface of an amorphous quartz substrate 11. Thus, the thickness $\lambda/2(n-1)$ of this layer 12 typically is approximately equal to $\lambda/2(1.5-1) = \lambda$, i.e., approximately equal to the wavelength of the optical radiation. Note that in case the source 106 (FIG. 1) radiates many different (unwanted) wavelengths, a suitable filter(s) can be inserted into the system 200, to ensure essentially monochromatic radiation and hence reduce chromatic aberration at the photoresist layer 101, as known in the art.

Figure 3:
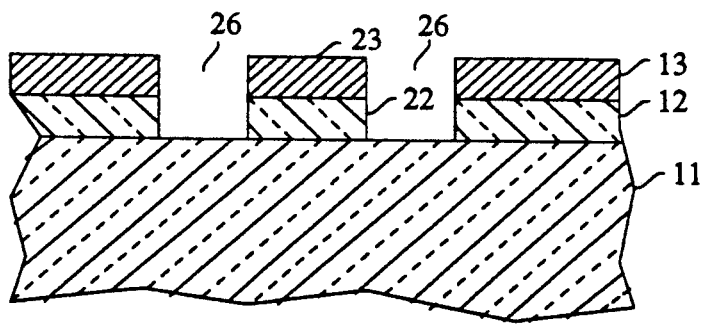

After development of the resist layer 14, by a standard resist development technique, a aperture (trench) is formed through the resist everywhere in region 25; that is to say, this resist layer is "patterned". Using this patterned resist layer as a protective layer against etching as known in the art the chromium layer 13 and the layer 12 are subjected to either isotropic or anisotropic etching. Then the patterned resist layer is then removed. In this way, as shown in FIG. 3, trench(es) 26 are formed penetrating through the layers 12 and 13 in regions underlying the original region 25 of the original resist layer 14. These trenches advantageously do not penetrate through any optically significant thickness of the substrate 11, unless such penetration is taken into account in the phase-shifting.

For example, to etch the chromium layer 13, wet etching with an etchant such as cerric ammonium nitrate can be used; and to etch the layer 12 but not the quartz substrate 11, a mixture of 10:1 HF and 40% NH₃F, in a 3:50 volume ratio, can be used. As viewed from above, the trenches 26 typically form either a square ring or a pair (or cluster, now shown) of elongated parallel rectangles.

The resist layer 14 is removed, and a new positive resist layer 24 (FIG. 4) is deposited all over the top surface of a desired mask 500 (FIG. 5) being fabricated. Following a non-critical alignment step, this new resist layer 24 is subjected to an electron beam bombardment in region 27 (FIG. 4) sufficient to render this region soluble in a developing solution. This region 27 completely covers the islands 23 and 22, and partially covers the trenches 26 (FIG. 3), but advantageously does not anywhere overlie the remaining (peripheral) regions of the layers 12 and 13.

It should be noted that the boundaries between regions 24 and 27 of the resist layer (FIG. 4) need not be precisely aligned, so long as they are located somewhere (anywhere) within the aperture (trench) 26

(FIG. 3). This lack of need for precise alignment gives rise to the term "self-aligned"—i.e., the edges of the island layer 22 will automatically be precisely aligned with those of the remaining peripheral regions of the layers 12 and 13 so long as the boundaries between the regions 24 and 27 of the resist layer fall anywhere within the trenches 26 (FIG. 3). In turn, these boundaries between the regions 24 and 27 of the resist layer are determined by the alignment of the electron beam used for patterning the resist layer 24 (FIG. 4) relative to the electron beam used for patterning the resist layer 14 (FIG. 2). The edges of the island layer 22 can be viewed as a second lithographic level, whereas those of the remaining peripheral regions of the layer 12 can be viewed as a first lithographical level—the two levels being automatically aligned.

Figure 1:
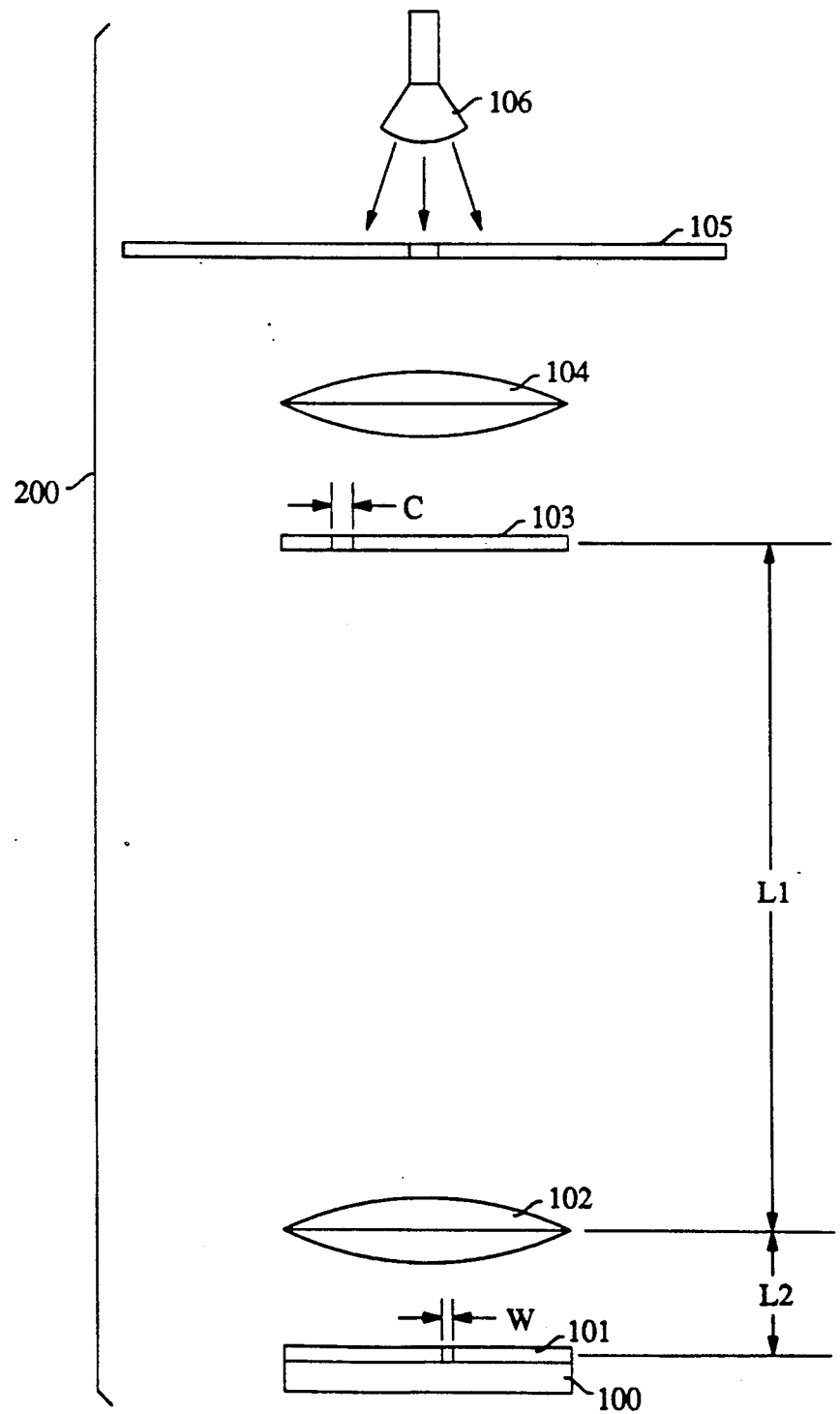
FIG. 1 is a diagram of a typical system for fabricating semiconductor integrated circuits by photolithography.

The resist layer 24 is then developed ("patterned") whereby region 27 of the resist layer is removed. Then, using the remaining region 24 of the resist as a protective mask against etching, the chromium island 23 is differentially etched, i.e., again by a method whereby the island layer 22 remains intact. In this way, the desired mask 500 (FIG. 5) is formed, typically having a square-shaped overall aperture 28 of overall width A with a square-shaped island 22 made of transparent phase-shifting material of width C. Alternatively, the overall aperture 28 is typically in the form of an elongated rectangle, of width A, with a central phase-shifting portion 22, also in the form of an elongated rectangle, of width C. This mask 500 can then be used as the reticle 103 in the system 200 (FIG. 1).

Figure 4:
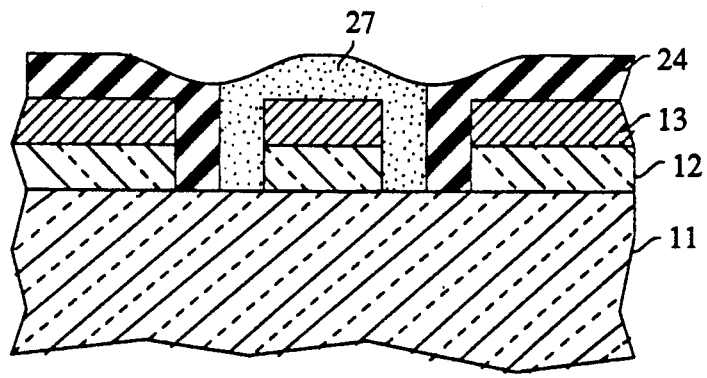
Figure 6:
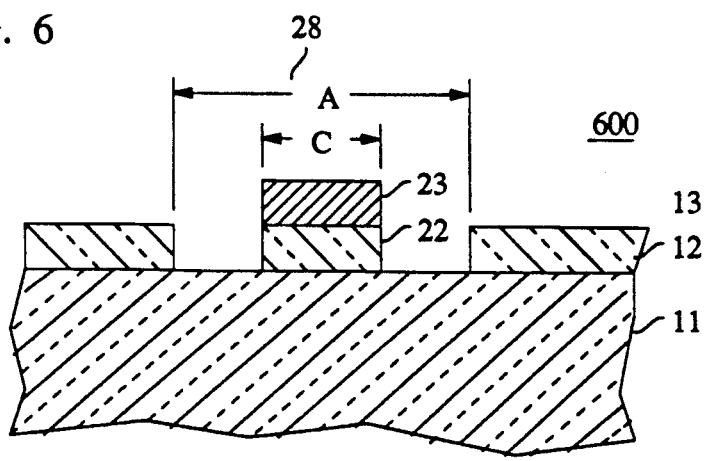
FIG. 6 is a side elevational view in cross section of a phase-shifting mask which has been manufactured in accordance with another specific embodiment of the invention.

Referring now to FIG. 6, a phase-shifting mask 600 has been manufactured in accordance with another embodiment of the invention. More specifically, this mask 600 has been manufactured in the same way as the mask 500 (FIG. 5) except that during the former's manufacturing a negative resist layer has been substituted for the positive resist layer 24 (FIG. 4). Thus, the pattern of the chromium layer is the opposite (complementary) in the mask 600 vs. the mask 500, as is desired in practical applications where the desired optical image on the photoresist layer 101 (FIG. 1) is to be complementary—for example, when the photoresist layer 101 itself is negative instead of positive or when the desired feature to be imparted to the wafer 100 is to be made complementary (e.g., interchanging an elongated metallized line for an elongated space).

Although the invention has been described in detail in terms of specific embodiments, various modifications can be made without departing from the scope of the invention. Instead of chromium other opaque materials can be used such as molybdenum silicide. Moreover, instead of the layer 12 being a separate layer to be etched in a pattern, a top portion of the substrate 11 itself can be etched in the same pattern, provided the uniformity of the depth of such etching across the top surface of the substrate 11 can be controlled within ±5 per centum, which is believed to be feasible within the state of the art. In this way, there would be no need for the layer 12 to be a separate layer at all. Also, thicknesses of layer 12 corresponding to phase-shifts other than $\pi$ radians can be used, in accordance with diffraction principles. Moreover, the shape of the aperture 26 need not be square-ring, but can be circular-ring or other ring. Finally, values of the ratio C/W are advantageously selected in accordance with the teachings of the aforementioned patent application (J. G. Garofalo 3-4-13) U.S. Pat. No. 07/622680 entitled "Phase-Shifting Lithographic Masks with Improved Resolution."

We claim:

1. A method of manufacturing a phase-shifting mask device comprising the steps of:
   (a) forming a trench penetrating through the entire thickness of an opaque material layer, located on a top major surface of a transparent material layer, and through at least a portion of the thickness of the transparent material layer whereby the transparent material layer has edges;
   (b) forming a resist layer over the entire top surface of the opaque layer and of the trench;
   (c) patterning the resist layer, whereby it becomes a patterned resist layer having a boundary edge located anywhere within the trench and whereby a portion of the area of the top surface of the opaque layer becomes an exposed portion; and
   (d) etching entire thickness of the opaque layer in regions thereof underlying the exposed portion of the area of the top surface of the opaque layer, whereby the edges of the transparent layer are not affected by the etching.

2. The method of claim 1 in which the transparent layer is located upon a substrate having a chemical composition which is different from that of the transparent layer.

3. A photolithographic method including the steps of:
   (a) forming a device in accordance with the steps recited in claim 2;
   (b) directing optical radiation onto the device, and focusing the optical radiation propagating through the device onto a photoresist layer located on a major surface of the wafer;
   (c) developing the photoresist layer, whereby a patterned photoresist layer is formed; and
   (d) etching the major surface of wafer, whereby the pattern of the patterned photoresist layer is transferred to the wafer.

4. A photolithographic method including the steps of:
   (a) forming a device in accordance with the steps recited in claim 2;
   (b) directing optical radiation onto the device, and focusing the radiation propagating through the device onto a photoresist layer located on a layer of material located on a major surface of a wafer;
   (c) developing the photoresist layer, whereby a patterned photoresist layer is formed; and
   (d) etching the layer of material, whereby the pattern of the patterned photoresist layer is transferred to the layer of material.

5. A photolithographic method of making semiconductor integrated circuits including the steps of:
   (a) forming a device in accordance with the steps recited in claim 2;
   (b) directing optical radiation onto the device, and focusing the optical radiation propagating through the device onto a photoresist layer located on a major surface of a semiconductor wafer;
   (c) developing the photoresist layer, whereby a patterned photoresist layer is formed; and
   (d) etching the major surface of the wafer, whereby the pattern of the patterned photoresist layer is transferred to the wafer.

6. A lithographic method of making semiconductor integrated circuits by optical lithography comprising the steps of:

(a) forming a device in accordance with the steps recited in claim 2;
(b) directing optical radiation onto the device, and focusing the radiation emanating from the device onto a photoresist layer located on a layer of material located on a major surface of a semiconductor wafer;
(c) developing the photoresist layer, whereby a patterned photoresist layer is formed; and
(d) etching the layer of material, whereby the pattern of the patterned photoresist layer is transferred to the layer of material.

7. A method of patterning a wafer including the steps of:
(a) forming a device in accordance with the steps recited in claim 1;
(b) directing optical radiation onto the device, and focusing the optical radiation propagating through the device onto a photoresist layer located on a major surface of the wafer;
(c) developing the photoresist layer, whereby a patterned photoresist layer is formed; and
(d) etching the major surface of the wafer, whereby the pattern of the patterned photoresist layer is transferred to the wafer.

8. A photolithographic method including the steps of:
(a) forming a device in accordance with the steps recited in claim 1;
(b) directing optical radiation onto the device, and focusing the radiation propagating through the device onto a photoresist layer located on a layer of material located on a major surface of a wafer;
(c) developing the photoresist layer, whereby a patterned photoresist layer is formed; and
(d) etching the layer of material, whereby the pattern of the patterned photoresist layer is transferred to the layer of material.

9. A photolithographic method of making semiconductor integrated circuits including the steps of:
(a) forming a device in accordance with the steps recited in claim 1;
(b) directing optical radiation onto the device, and focusing the optical radiation propagating through the device onto a photoresist layer located on a major surface of a semiconductor wafer;
(c) developing the photoresist layer, whereby a patterned photoresist layer is formed; and
(d) etching the major surface of the wafer, whereby the pattern of the patterned photoresist layer is transferred to the wafer.

10. A photolithographic method including the steps of:
(a) forming a device in accordance with the steps recited in claim 1;
(b) directing optical radiation onto the device, and focusing the radiation emanating from the device onto a photoresist layer located on a layer of material located on a major surface of a wafer;
(c) developing the photoresist layer, whereby a patterned photoresist layer is formed; and
(d) etching the layer of material, whereby the pattern of the patterned photoresist layer is transferred to the layer of material.

* * * * *